(12) United States Patent
Kandler et al.

(10) Patent No.: US 9,810,727 B2
(45) Date of Patent: Nov. 7, 2017

(54) SENSOR SYSTEM FOR A MOTOR VEHICLE

(71) Applicant: TAKATA AG, Aschaffenburg (DE)

(72) Inventors: Marcus Kandler, Aschaffenburg (DE); Albrecht Kretzschmar, Niederselters (DE)

(73) Assignee: TAKATA AG, Aschaffenburg (DE)

( * ) Notice: Subject to any disclaimer, the term of this patent is extended or adjusted under 35 U.S.C. 154(b) by 260 days.

(21) Appl. No.: 14/353,109

(22) PCT Filed: Oct. 19, 2012

(86) PCT No.: PCT/EP2012/070777
§ 371 (c)(1),
(2) Date: Apr. 21, 2014

(87) PCT Pub. No.: WO2013/057263
PCT Pub. Date: Apr. 25, 2013

(65) Prior Publication Data
US 2014/0253151 A1 Sep. 11, 2014

(30) Foreign Application Priority Data

Oct. 20, 2011 (DE) .................. 10 2011 084 903

(51) Int. Cl.
G01R 27/26 (2006.01)
B62D 1/04 (2006.01)
(Continued)

(52) U.S. Cl.
CPC ......... *G01R 27/2605* (2013.01); *B60N 2/002* (2013.01); *B62D 1/046* (2013.01);
(Continued)

(58) Field of Classification Search
CPC ..... G01R 27/2605; G06K 9/0002; G01D 5/24
(Continued)

(56) References Cited

U.S. PATENT DOCUMENTS 3,585,626 A 6/1971 Tartarini
4,484,026 A 11/1984 Thornburg
(Continued)

FOREIGN PATENT DOCUMENTS

DE 601 22 159 12/2001
DE 203 09 877 12/2003
(Continued)

OTHER PUBLICATIONS

International Preliminary Report on Patentability and Written Opinion, dated Apr. 22, 2014, in connection with corresponding International Application No. PCT/EP2012/070777 (8 pages).
(Continued)

*Primary Examiner* — Tung X Nguyen
*Assistant Examiner* — Dominic Hawkins
(74) *Attorney, Agent, or Firm* — Meunier Carlin & Curfman LLC

(57) ABSTRACT

A sensor system for a motor vehicle is provided. The sensor system comprises a flat shielding element which is electrically conductive and to which an electric potential can be applied, and at least one capacitive sensor element which includes an electrically conducting structure which is arranged on one side of the shielding element. As electrically conducting structure the sensor element includes at least one sensor conductor which forms a sewing thread and is sewn onto the one side of the shielding element.

19 Claims, 5 Drawing Sheets

(51) Int. Cl.
*B62D 1/06* (2006.01)
*B60N 2/00* (2006.01)
*G01L 1/14* (2006.01)
*G01L 1/26* (2006.01)
*G01L 5/22* (2006.01)

(52) U.S. Cl.
CPC ............... *B62D 1/06* (2013.01); *G01L 1/142* (2013.01); *G01L 1/144* (2013.01); *G01L 1/26* (2013.01); *G01L 5/221* (2013.01)

(58) Field of Classification Search
USPC .................. 324/686, 687; 74/552; 73/117.02
See application file for complete search history.

(56) References Cited

U.S. PATENT DOCUMENTS

| | | | |
|---|---|---|---|
| 4,540,979 A | 9/1985 | Gerger | |
| 4,556,845 A * | 12/1985 | Strope | G01B 7/105 324/230 |
| 4,631,976 A | 12/1986 | Noda et al. | |
| 4,801,771 A | 1/1989 | Mizuguchi et al. | |
| 4,929,934 A | 5/1990 | Ueda et al. | |
| 5,398,962 A | 3/1995 | Kropp | |
| 5,423,569 A | 6/1995 | Reighard et al. | |
| 5,453,941 A | 9/1995 | Yoshikawa | |
| 5,463,258 A | 10/1995 | Filion et al. | |
| 5,539,259 A | 7/1996 | Filion et al. | |
| 5,793,297 A | 8/1998 | Takeuchi et al. | |
| 5,871,063 A | 2/1999 | Young | |
| 5,914,658 A | 6/1999 | Arakawa | |
| 5,964,478 A | 10/1999 | Stanley et al. | |
| 5,965,952 A | 10/1999 | Podoloff et al. | |
| 6,016,103 A | 1/2000 | Leavitt | |
| 6,172,610 B1 | 1/2001 | Prus | |
| 6,333,736 B1 | 12/2001 | Sandbach | |
| 6,378,384 B1 | 4/2002 | Atkinson et al. | |
| 6,392,542 B1 * | 5/2002 | Stanley | B60N 2/002 280/735 |
| 6,501,463 B1 | 12/2002 | Dahley et al. | |
| 6,590,499 B1 | 7/2003 | D'Agosto | |
| 6,661,345 B1 | 12/2003 | Bevan | |
| 6,703,845 B2 | 3/2004 | Stanley et al. | |
| 6,906,700 B1 | 6/2005 | Armstrong | |
| 7,126,583 B1 | 10/2006 | Breed | |
| 7,649,278 B2 | 1/2010 | Yoshida et al. | |
| 7,688,213 B2 | 3/2010 | Power | |
| 7,830,265 B2 | 11/2010 | Power | |
| 7,928,341 B2 * | 4/2011 | Ito | B60N 2/002 219/202 |
| 8,011,234 B2 * | 9/2011 | Kandler | B60R 21/0132 73/117.02 |
| 8,203,454 B2 | 6/2012 | Knight et al. | |
| 8,214,105 B2 | 7/2012 | Daly et al. | |
| 8,269,731 B2 | 9/2012 | Molne | |
| 8,564,424 B2 * | 10/2013 | Evarts | B60Q 9/00 340/426.24 |
| 8,983,732 B2 | 3/2015 | Bosch et al. | |
| 2002/0054060 A1 | 5/2002 | Schena | |
| 2003/0043014 A1 | 3/2003 | Nakazawa et al. | |
| 2003/0074092 A1 | 4/2003 | Carrabis | |
| 2003/0076968 A1 | 4/2003 | Rast | |
| 2003/0083131 A1 | 5/2003 | Armstrong | |
| 2003/0111453 A1 | 6/2003 | Haag et al. | |
| 2004/0144197 A1 | 7/2004 | O'Grady | |
| 2004/0212189 A1 | 10/2004 | Kachu | |
| 2004/0267422 A1 * | 12/2004 | Bossler | B62D 1/06 701/41 |
| 2005/0052426 A1 | 3/2005 | Hagermoser et al. | |
| 2005/0067889 A1 | 3/2005 | Chernoff et al. | |
| 2005/0260492 A1 | 11/2005 | Tucholski et al. | |
| 2005/0273218 A1 | 12/2005 | Breed et al. | |
| 2006/0025897 A1 | 2/2006 | Shostak et al. | |
| 2006/0054479 A1 | 3/2006 | Iisaka et al. | |
| 2006/0113880 A1 | 6/2006 | Pei et al. | |
| 2006/0177212 A1 | 8/2006 | Lamborghini et al. | |
| 2006/0231320 A1 * | 10/2006 | Kamizono | B60N 2/002 180/273 |
| 2006/0248478 A1 | 11/2006 | Liau | |
| 2007/0029768 A1 * | 2/2007 | Clos | B60R 21/01532 280/735 |
| 2007/0062753 A1 | 3/2007 | Yoshida et al. | |
| 2007/0100523 A1 | 5/2007 | Trachte | |
| 2007/0278214 A1 | 12/2007 | Weiss et al. | |
| 2008/0042856 A1 | 2/2008 | Power | |
| 2008/0079604 A1 | 4/2008 | Madonna et al. | |
| 2008/0202912 A1 | 8/2008 | Boddie et al. | |
| 2008/0210048 A1 | 9/2008 | Yoneyama et al. | |
| 2009/0009480 A1 | 1/2009 | Heringslack | |
| 2009/0140994 A1 | 6/2009 | Tanaka et al. | |
| 2009/0151447 A1 | 6/2009 | Jin et al. | |
| 2009/0160529 A1 | 6/2009 | Lamborghini et al. | |
| 2009/0199676 A1 | 8/2009 | Kandler | |
| 2009/0241378 A1 | 10/2009 | Ellis | |
| 2010/0045454 A1 | 2/2010 | Knight et al. | |
| 2010/0045612 A1 | 2/2010 | Molne | |
| 2010/0102972 A1 | 4/2010 | Middlekauff et al. | |
| 2010/0130808 A1 | 5/2010 | Hattori | |
| 2010/0168998 A1 | 7/2010 | Matsunaga | |
| 2010/0231239 A1 * | 9/2010 | Tateishi | G01D 5/24 324/672 |
| 2010/0277186 A1 * | 11/2010 | Bieck | B60N 2/002 324/674 |
| 2010/0315267 A1 | 12/2010 | Chung et al. | |
| 2011/0037721 A1 | 2/2011 | Cranfill | |
| 2011/0046788 A1 | 2/2011 | Daly et al. | |
| 2011/0054359 A1 | 3/2011 | Sazonov et al. | |
| 2011/0115617 A1 | 5/2011 | Bennett | |
| 2011/0133919 A1 | 6/2011 | Evarts et al. | |
| 2011/0175844 A1 | 7/2011 | Berggren | |
| 2011/0189890 A1 * | 8/2011 | Lee | H01R 13/422 439/578 |
| 2011/0210926 A1 | 9/2011 | Pasquero et al. | |
| 2011/0216015 A1 | 9/2011 | Edwards | |
| 2011/0241850 A1 | 10/2011 | Bosch et al. | |
| 2011/0245992 A1 | 10/2011 | Stahlin et al. | |
| 2011/0246028 A1 | 10/2011 | Lisseman et al. | |
| 2011/0257846 A1 | 10/2011 | Bennett | |
| 2011/0290038 A1 | 12/2011 | Hoshino et al. | |
| 2012/0126965 A1 | 5/2012 | Sanma et al. | |
| 2012/0179328 A1 | 7/2012 | Goldman-Shenhar | |
| 2012/0232751 A1 | 9/2012 | Guspan | |
| 2012/0296528 A1 | 11/2012 | Wellhoefer et al. | |
| 2012/0306512 A1 | 12/2012 | Kandler | |
| 2012/0326735 A1 | 12/2012 | Bennett et al. | |
| 2013/0009654 A1 | 1/2013 | Kandler | |
| 2014/0054880 A1 | 2/2014 | Feinstein | |
| 2014/0151356 A1 | 6/2014 | Maquire et al. | |
| 2014/0224040 A1 | 8/2014 | Van'tZelfde et al. | |
| 2014/0331815 A1 | 11/2014 | Rispoli et al. | |

FOREIGN PATENT DOCUMENTS

| | | |
|---|---|---|
| DE | 20 2004 020 425 | 8/2005 |
| DE | 10 2005 024 432 | 10/2006 |
| DE | 10 2009 058 138 | 10/2006 |
| DE | 10 2006 031 207 | 11/2007 |
| DE | 10 2007 024 141 | 11/2008 |
| DE | 10 2009 055 424 | 7/2011 |
| DE | 10 2009 055 426 | 7/2011 |
| JP | 2011-063103 | 3/2011 |

OTHER PUBLICATIONS

"Modellierung und Realisierung eines digitalen Trägerfrequenzmesssystems zur Messung von kapazitiven Sensoren im Umfeld einer Ultrapräzisionsdrehmaschine" Dipl.—Ing. Jonas Bluth aus Rutesheim.

Final Office Action issued in U.S. Appl. No. 14/728,366, dated May 25, 2017.

(56) References Cited

OTHER PUBLICATIONS

International Search Report and Written Opinion, dated Sep. 2, 2015, received in connection with International Application No. PCT/US2015/033708.
International Preliminary Report on Patentability, dated Dec. 15, 2016, received in connection with International Application No. PCT/US2015/033708.
International Search Report and Written Opinion, dated Aug. 28, 2015, received in connection with International Application No. PCT/US2015/032116.
International Preliminary Report on Patentability, dated Dec. 1, 2016 received in connection with International Application No. PCT/US2015/032116.
International Preliminary Report on Patentability and Written Opinion, dated Aug. 18, 2015, received in connection with PCT/US2014/016023.
International Search Report and Written Opinion, dated May 23, 2014, received in connection with International Application No. PCT/US2014/016023.
Co-pending U.S. Application No. 14/719,480, filed May 22, 2015, and its file history.
Office Action issued in Chinese Application No. 201480008587.9, dated Oct. 9, 2016, English translation included.
U.S. Appl. No. 14/178,578, filed Feb. 12, 2014, issued on Feb. 2, 2016 as U.S. Pat. No. 9,248,851, and its file history.
Notice of Allowance, dated Sep. 25, 2015, received in connection with U.S. Appl. No. 14/178,578, filed Feb. 12, 2014.
Non Final Office Action in U.S. Appl. No. 14/178,578 dated May 11, 2015.
Co-pending U.S. Appl. No. 14/728,366, filed Jun. 2, 2015, and its file history.
Non Final Office Action in U.S. Appl. No. 14/728,366 dated Nov. 21, 2016.

* cited by examiner

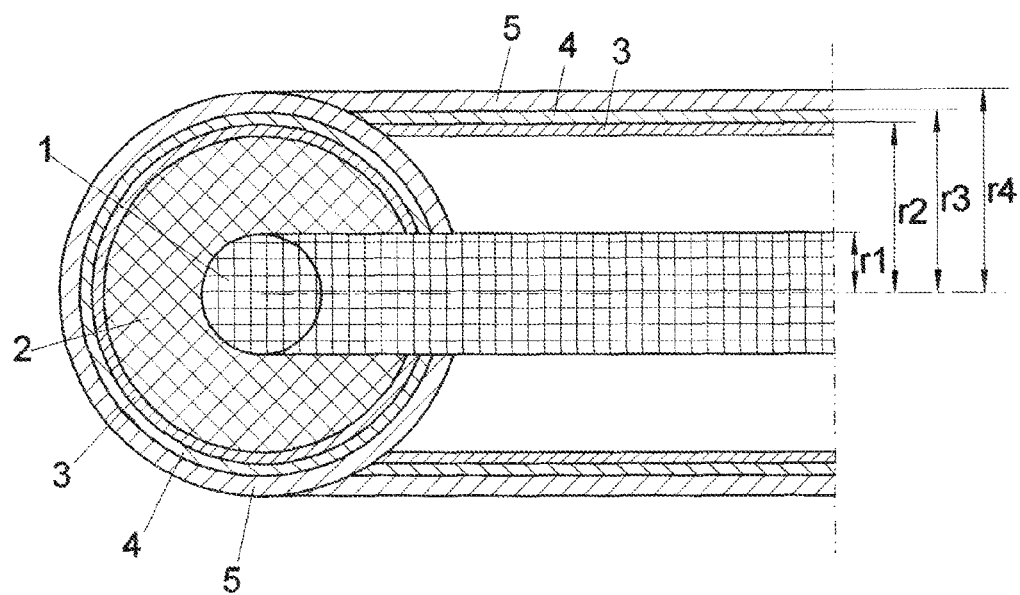
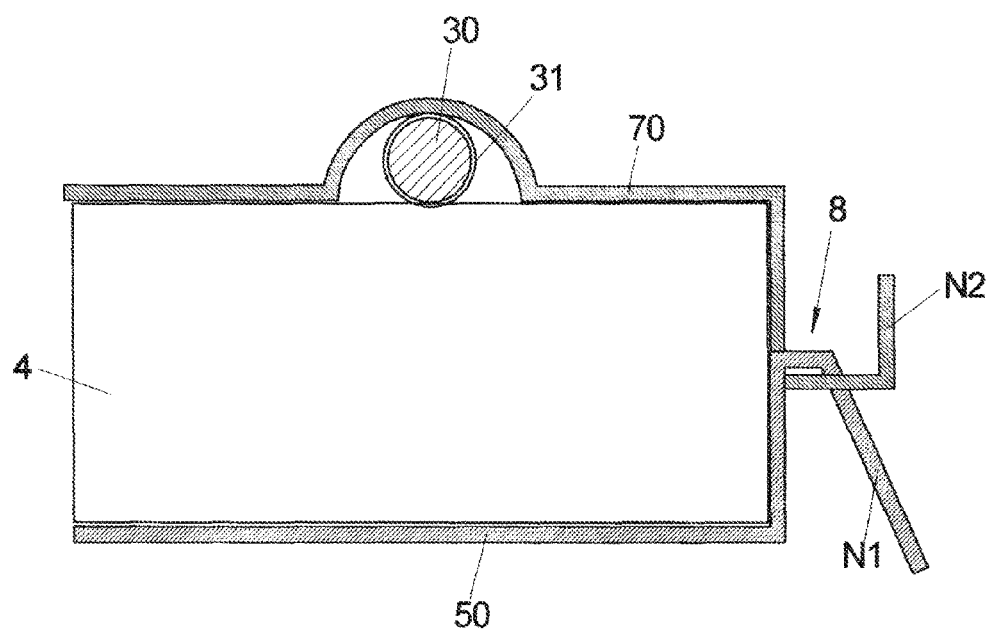

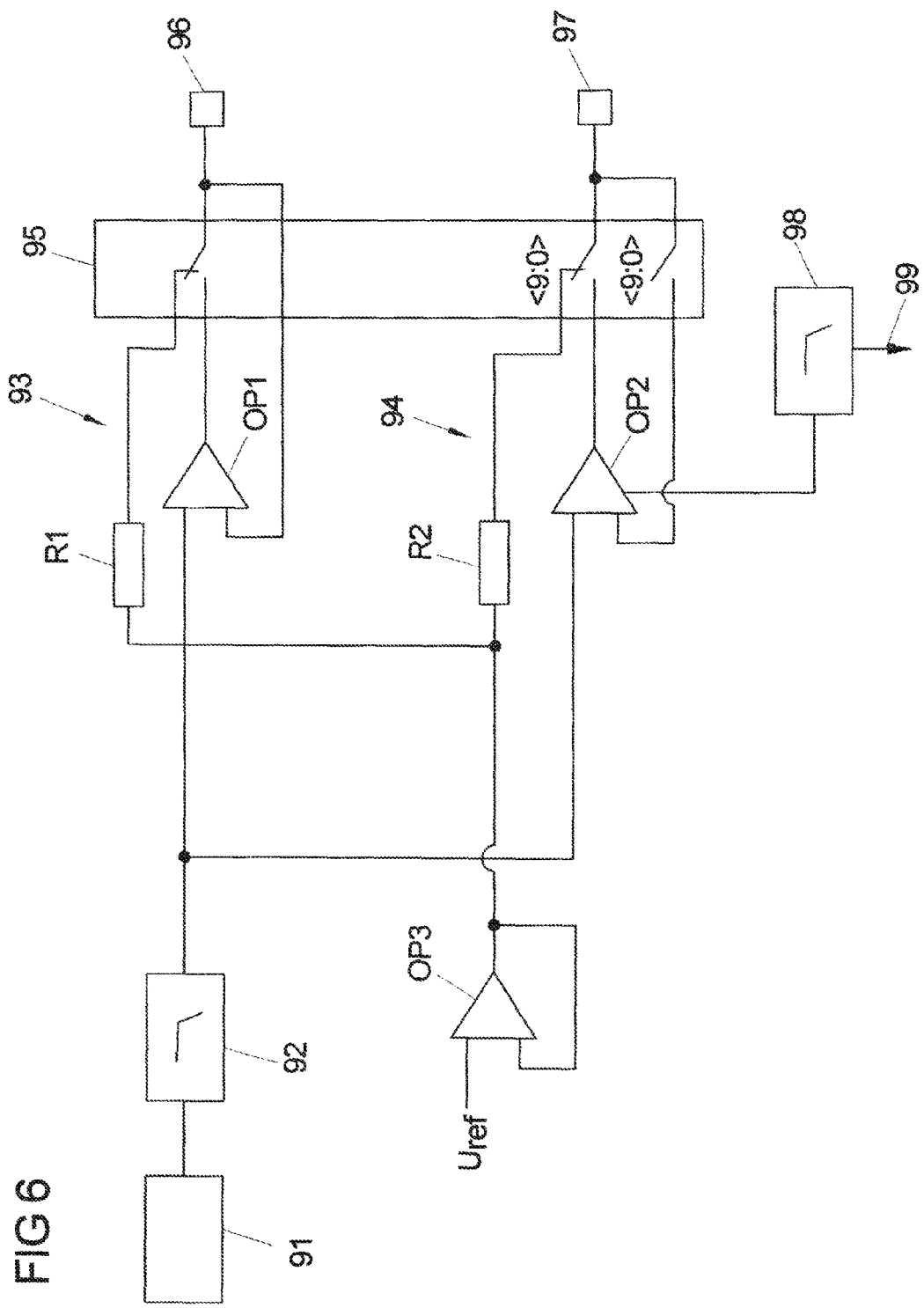

SENSOR SYSTEM FOR A MOTOR VEHICLE

CROSS-REFERENCE TO A RELATED APPLICATION

This application is a National Phase Patent Application of International Patent Application Number PCT/EP2012/070777, filed on Oct. 19, 2012, which claims priority of German Patent Application Number 10 2011 084 903.3, filed on Oct. 20, 2011.

BACKGROUND

This invention relates to a sensor system for a motor vehicle.

From DE 10 2009 055 424 A1 it is known to integrate into a vehicle component such as the steering wheel rim of a vehicle steering wheel or the sensor mat of a vehicle seat a capacitive sensor element which is connected to an evaluation unit which detects and evaluates at least one measurement quantity in dependence on the capacitive coupling of the capacitive sensor element to the surroundings. To provide a defined distance between the sensor element and an electric heating element, the capacitive sensor element is designed as outer conductor which surrounds an electric heating element formed in the form an inner conductor.

Further arrangements in which a sensor element is integrated into the steering wheel rim of a vehicle steering wheel are known from DE 10 2006 031 207 B3 and DE 10 2007 024 141 A1.

When integrating both a heating element and a capacitive sensor element into a vehicle component such as a steering wheel rim or a sensor mat, efforts should be made to avoid or at least minimize a mutual capacitive interference of heating element and capacitive sensor element. One problem is represented by the fact that parasitic capacitances between a capacitive sensor element and a heating wire of a heating element vary in dependence on the temperature of the heating wire and therefore are impossible to control.

SUMMARY

Correspondingly, it is an object underlying the present invention to provide a sensor system with a capacitive sensor element which avoids or minimizes an interference of a capacitive sensor element with parasitic capacitances.

The invention provides for by a sensor system which includes a flat shielding element and at least one capacitive sensor element with an electrically conducting structure. As electrically conducting structure, the sensor element includes at least one sensor conductor which forms a sewing thread and is sewn onto the one side of the shielding element.

According to an aspect of the invention, shielding against parasitic capacitances is effected by the shielding element, wherein a heating element is not necessarily provided. By forming the sensor conductor as sewing thread, the sensor conductor can directly be sewn into the shielding element, which allows a simple and yet safe arrangement of the sensor conductor.

In one exemplary aspect of the invention it is provided that the shielding element does not consist of one layer only, but includes several interconnected layers of different materials. At least one of the layers is electrically conductive and can be charged with an electric potential. For example, it can be provided that in addition to a layer which is electrically conductive and can be charged with an electric potential the shielding element includes at least one further layer which is made of a material which can be adhered, a foam material or a fleece.

Furthermore, it can be provided that the shielding element includes a fabric of metal threads, which forms a layer of the shielding element or the shielding element as a whole. A sensor conductor and a heating conductor are sewn onto the two sides of such metal fabric in the described way. It can be provided that both the heating conductor and the sensor conductor are provided with an insulation, for example a paint insulation.

In a further exemplary aspect of the invention it is provided that the sensor system comprises a circuit arrangement which drives the shielding element to the same potential as the sensor element. This can be effected for example by means of an operational amplifier. One exemplary embodiment thereof provides that a voltage signal is applied to the shielding element, which has the same phase as a measurement signal which is applied to the sensor element. It can be provided that the voltage signal which is applied to the shielding element is provided by the same circuit assembly which also provides the measurement signal. This involves the advantage that an equal-phase condition of the signals or voltages can be provided in a simple way. It can also be provided, that the measurement signal for the sensor element is directly applied to the shielding element, i.e. the same additionally serves to provide a defined potential at the shielding element.

By actively driving the shielding element to a certain potential by a circuit arrangement, an "active shield" against parasitic capacitances is provided. Parasitic capacitances are meant to be those capacitances which influence the measurement of the capacitance of the capacitive sensor element in a way not desired, for example the capacitance of a heating wire of a heating element or the capacitance of a steering wheel skeleton. By using an amplifier circuit which sets the shielding element to the same electric potential as the sensor or the electrode provided by the sensor, a capacitance between the shielding element and the capacitive sensor is suppressed completely in the ideal case. Thus, the change of the capacitance to be measured alone is left in the ideal case.

It should be noted, however, that it is not absolutely necessary according to the invention that the shielding element is actively driven to the same potential as the sensor element. On the one hand, it can alternatively be provided that the shielding element is driven to a potential other than the potential of the sensor element. As long as the shielding element has a defined potential, differences to the potential of the capacitive sensor element can be compensated via a measurement offset. On the other hand, it can alternatively be refrained from actively driving the shielding element to a certain potential, and it can merely be provided to electrically conductively connect the shielding element with a certain fixed or variable potential. In this case, too, the shielding element provides an effective protection against parasitic capacitances.

The sensor system according to the invention for example is integrated into a steering wheel rim of a vehicle steering wheel. It is provided for example that a shielding element, a heating element and a sensor element are formed in the steering wheel rim in a coaxial arrangement, i.e. in layers or planes arranged one above the other.

A further exemplary aspect of the invention provides that a sensor system according to the invention is integrated into a vehicle seat. Such integration for example is made into a sensor mat which is arranged between a seat cushion and a seat cover. The shielding element, at least one heating element and at least one capacitive sensor element are realized for example in a planar arrangement in different planes in the sensor mat.

According to a further, independent aspect of the invention a sensor system includes a flat shielding element which is electrically conductive and to which an electric potential can be applied. At least one heating element is arranged on a first side of the shielding element and at least one capacitive sensor element, which includes an electrically conducting structure, is arranged on a second side of the shielding element.

By providing a flat shielding element between a heating element and a capacitive sensor element, the heating element and the sensor element are capacitively decoupled. In particular, it largely is prevented that the capacitive field of the capacitive sensor element is influenced by the heating element and in particular its temperature-dependent parasitic capacitance.

The heating element rather is masked out by the shielding element in capacitive terms. Beside masking out the capacitance of the heating element, this masking out of capacitances and resulting interferences in the field of the capacitive sensor element can comprise the masking out of the capacitance of further metallic objects, such as the masking out of the capacitance of a steering wheel skeleton, in case such further metallic objects likewise lie behind the shielding element from the point of view of the capacitive sensor element.

The electrically conducting structure of the capacitive sensor element of the sensor system according to the invention forms an electrode which is connectable to an evaluation unit. The evaluation unit measures at least one measurement quantity which depends on the capacitive coupling of the capacitive sensor element or the electrode provided by the same to the surroundings. It can be provided that the capacitance of the electrode formed by the capacitive sensor element is measured with respect to a reference potential, which is provided by vehicle components such as the vehicle body or components of a vehicle seat. Such vehicle components represent a fictitious second electrode, to which the capacitance is measured. It is well known that the capacitance depends on the dielectric constant of the medium which is present between the two electrodes or between the electrode of the capacitive sensor element and the reference potential. Since the human body also has dielectric properties, the capacitance of the human body or a body part changes when the same approaches the capacitive sensor, which is detected by the connected evaluation unit. For example, when the hand of a driver touches a steering wheel into which a sensor system according to the invention is integrated, a change in capacitance is effected in the surroundings of the capacitive sensor due to the related change in the dielectric constant, which is detected and evaluated.

By means of the capacitive sensor, the presence of a human person or a body part in the vicinity of or at a considered vehicle component, into which the sensor is integrated, thus can be detected. The sensor system according to the invention generally provides for detecting the presence of vehicle occupants or of body parts of vehicle occupants in defined regions.

For detecting a change in the capacitance of a capacitive sensor element by an evaluation unit, various measurement methods are possible. For example, it is provided that the capacitance of the capacitive sensor element is part of a resonant circuit whose resonance frequency and/or phase and/or oscillation amplitude will change with a change in capacitance. According to another exemplary embodiment, an evaluation unit applies a modulated measurement signal to the capacitive sensor. For example, this is an alternating current or an alternating voltage, which with a certain frequency which can be a low frequency or a high frequency is supplied to the capacitive sensor element and its conductive structure. A change in capacitance is detected by evaluating a change in phase and/or amplitude of such measurement signal.

The alternating current or the alternating voltage for example is of the low-frequency type and for example has a frequency between 80 Hz and 150 Hz, for example a frequency of 120 Hz. In principle, however, other and higher frequencies can also be used.

The solution according to the invention has the further advantage that it provides an arrangement which is optically satisfactory and in particular avoids that the heating element and/or sensor element stand out with respect to an adjacent surface such as for example a steering wheel leather surface. The solution according to the invention provides a flat shielding element, on both sides of which the heating element and the capacitive sensor element are integrated. Heating element and sensor element hence lie in different planes, which avoids space problems. Due to the possibility of embedding the outer element (heating element or capacitive sensor element) in the shielding element, standing out towards the outside, e.g. on a steering wheel surface, can be avoided.

A further advantage of the solution according to the invention consists in that by integrating both a heating element and a capacitive sensor element into a flat shielding element a sensor system is provided, which is easy to handle and can easily be integrated into a vehicle component.

In one exemplary aspect of the invention, the heating element includes at least one heating conductor which is sewn onto the one side of the shielding element. Such sewing on the one hand can be effected in that the heating conductor itself forms a sewing thread in the sense that it is interlaced with the shielding element and/or at least one further thread or wire. On the other hand, sewing the heating conductor onto the one side of the shielding element can be effected by using an additional holding thread. By means of such additional holding thread, the heating conductor is sewn onto the one side of the shielding element, wherein the holding thread fixes the heating thread on the considered side of the shielding element.

It can be provided that the holding thread is made of a non-conducting material. This can be advantageous in particular when the holding thread forms a seam with a sensor conductor—as will yet be explained further below—, wherein sensor conductor and holding thread form face thread and bottom thread of the seam. In principle, however, it can likewise be provided that the holding thread is formed by an electrically conducting wire. Such electrically conducting wire for example can be a sensor wire or a heating wire of a further sensor or a further heating circuit.

The sensor conductor in principle can be an arbitrary one- or multipart electrically conductive element, e.g. a wire, a flat conductor or a thread or mesh formed of a conductive plastic material.

In one exemplary aspect it is provided that both the heating element and the capacitive sensor each include a conductor in the form of a wire which forms a sewing thread, wherein the one sewing thread is arranged on the one side of the flat shielding element and the other sewing thread is arranged on the other side of the flat shielding element. It can be advantageous that the two threads do not touch each other, in order to avoid mutual capacitive interferences. Correspondingly, it is provided in one aspect that one of the two sewing threads forms a seam with a holding thread which fixes the other one of the sewing threads on the other side of the shielding element. When the heating conductor for example is fixed on the one side of the shielding element by means of a holding thread, this holding thread forms a seam together with a sensor conductor on the other side of the shielding element, wherein sensor conductor and holding thread form face thread and bottom thread of the seam.

However, if the sensor conductor is sewn onto the other side of the shielding element by means of a holding thread, and the heating conductor on the one side forms a sewing thread, it can be provided that the heating conductor and the holding thread form a seam and in doing so form face thread and bottom thread of the seam. It can also be provided that both the heating conductor and the sensor conductor are fixed on the respective side of the shielding element by means of a holding thread, for which case the two holding threads form a seam.

In all cases, the flat shielding element serves as carrier material both for the heating conductor (on the one side of the shielding element) and for the sensor conductor (on the other side of the sensor element). These conductors then are sewn up, either directly or by using at least one additional holding thread.

BRIEF DESCRIPTION OF THE DRAWINGS

The invention will be explained in detail below by means of several exemplary embodiments with reference to the Figures of the drawing, FIG. 1 in a partly sectional perspective view schematically shows the structure of a steering wheel rim of a vehicle steering wheel, wherein a shielding element, a heating element and a capacitive sensor element are integrated into the steering wheel rim, FIG. 2 schematically shows the steering wheel rim of FIG. 1 in cross-section;

FIG. 3 shows a schematic representation of an exemplary embodiment of a sensor system with a shielding element, a heating element and a capacitive sensor element, wherein the sensor element is formed as sewing thread.

FIG. 6 shows a circuit arrangement for providing a measurement signal and a voltage signal for a sensor system.

DETAILED DESCRIPTION

Figure 1:
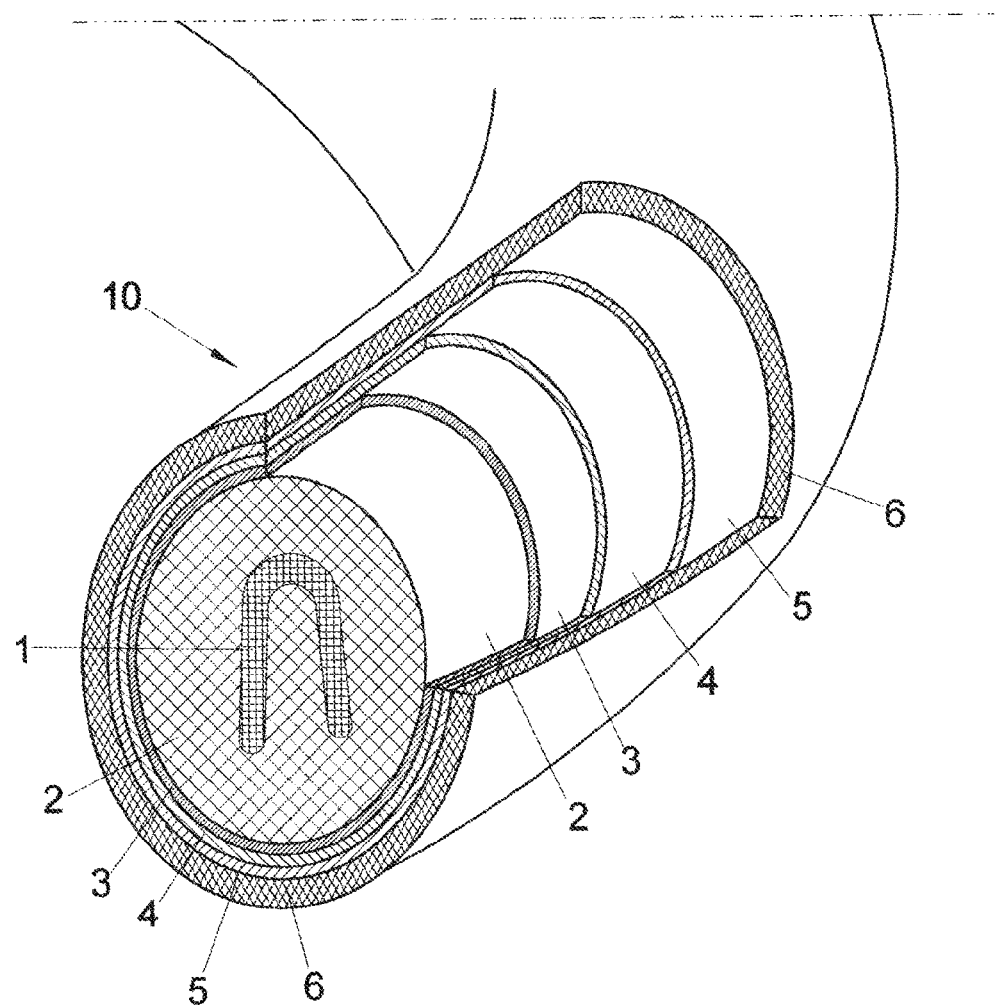

FIG. 1 shows a partly sectional, perspective view of the structure of a steering wheel rim 10 of a vehicle steering wheel. In its interior, the steering wheel rim 10 includes a metallic skeleton 1 which is surrounded by a dielectric 2. The dielectric 2 for example consists of a foamed material, such as a polyurethane foam or a synthetic rubber. It can also be provided that the dielectric 2 consists of several layers of different material. The dielectric 2 subsequently will also be referred to as foam layer.

The foam layer 2 is surrounded by a heating layer 3 which includes one or more heating elements. In particular, the heating layer 3 comprises an electrically conductive material which heats up due to its ohmic resistance, as soon as a voltage is applied. Such electrically conductive material for example is formed by a heating wire which is formed in the heating layer 3. In the following, no distinction is made between the heating layer 3 and the heating elements formed in the same, since the heating elements form the heating layer.

Towards the outside, the heating layer 3 is adjoined by a shielding element 4. The shielding element 4 includes at least one layer which is electrically conductive and to which an electric potential can be applied, for example via a contact pad. It can be provided that in addition to such electrically conductive layer the shielding element 4 includes further layers. Exemplary embodiments thereof will be explained with reference to FIGS. 4A to 4G.

The shielding element 4 is surrounded by a sensor layer 5 which includes at least one capacitive sensor element. The capacitive sensor element comprises at least one single- or multipart electrically conductive element, which in the considered exemplary embodiment is formed by a sensor wire. Instead of a sensor wire, other conductive elements having capacitive properties, such as e.g. flat conductors or electrically conductive foils, also can be employed. In the following, no distinction is made between the sensor layer 5 and the capacitive sensor elements formed in the same, since the capacitive sensor elements form the sensor layer.

The sensor layer 5 is adjoined by a cover 6 of the steering wheel rim 10, which for example is made of leather and represents the outer envelope of the steering wheel rim 10.

The heating element 3, the shielding element 4 and the sensor element 5 are arranged in the steering wheel rim in a coaxial arrangement and form successive layers of the steering wheel rim 10.

To the capacitive sensor element 5 an evaluation unit (not shown) is associated, which measures the change in a measurement quantity, for example a measuring current, in dependence on the capacitive coupling of the capacitive sensor element to a reference potential. Such evaluation unit is described for example in DE 10 2009 055 424 A1, to which reference is made in so far.

By means of such evaluation unit it can be detected whether a vehicle occupant or another object is present in the surroundings of the capacitive sensor element 5. The corresponding measurement principle is shown schematically in FIG. 5 and will be explained below with reference to the same.

There is schematically shown a steering wheel L and a vehicle chassis C of a motor vehicle. The steering wheel L forms an electrode El1 which is provided by an electrically conducting structure of a capacitive sensor element integrated into the steering wheel rim L. The vehicle chassis C forms an imaginary second electrode El2 which provides a reference potential, usually the ground potential. Between the electrodes El1, El2 an electric field E exists. Its strength and hence the capacitance between the electrodes El1, El2 is influenced by a dielectric which is located in the electric field between the electrodes El1, El2. Such dielectric also is the human body. The closer the human body comes to electrode El1, the larger are the changes in capacitance.

When a person P present in the driver seat S touches the steering wheel rim, so that the hands of the driver get in the direct vicinity of the electrode El1, this leads to a strong change in the capacitance of the capacitive sensor element. Thus, placing a hand on or lifting the same from the vehicle steering wheel can be detected via a capacitive measurement (so-called hands-off recognition).

The described operating principle clearly shows that a capacitive sensor arrangement for detecting the presence of a person correspondingly also can be integrated for example into the vehicle seat S, for example in the form of a sensor mat which is located between a seat cover and a seat cushion. Another application is the arrangement of a capacitive sensor arrangement at a safety belt system.

Figure 5:
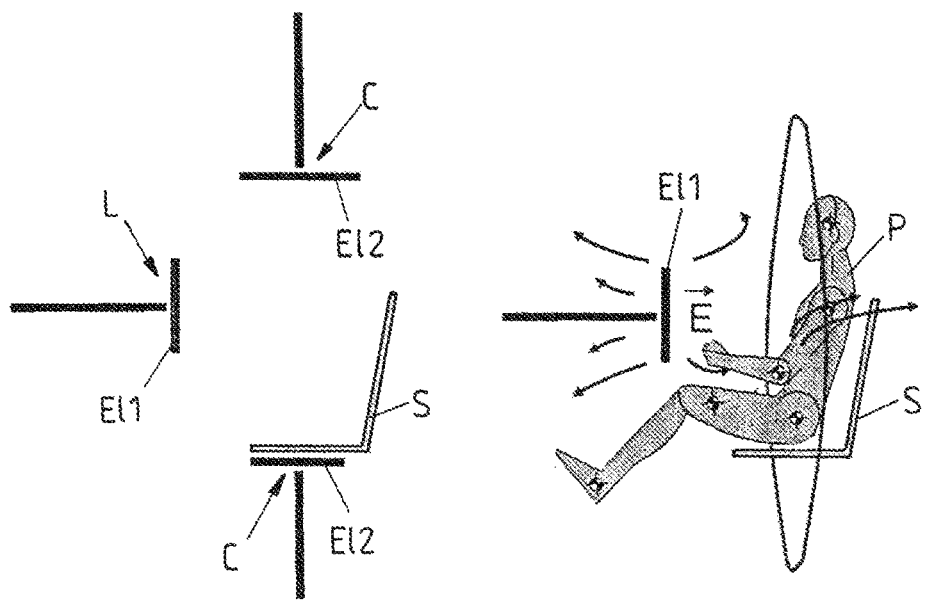
FIG. 5 shows the operating principle of a capacitively operating sensor using the example of a sensor integrated into a steering wheel rim

In a capacitive measurement it is important that the considered electrode of the capacitive sensor element, for example the electrode El1 of FIG. 5, as little as possible is subjected to parasitic capacitances which impede or prevent a meaningful measurement. In the structure described in FIG. 1, however, such parasitic capacitances in principle are formed by capacitances which are present between the sensor element 5 and the heating element 3 and between the sensor element 5 and the metallic skeleton 1. This will be explained below with reference to FIG. 2.

FIG. 2 shows a schematic representation of a sectional view through a steering wheel rim according to FIG. 1, wherein the skeleton 1 simply is shown circular in cross-section and the layers 3, 4, 5 simply are shown to be circular. The layer 6 of FIG. 1 is not shown in FIG. 2. Without the electrically conductive shielding element 4, a parasitic capacitance would be present on the one hand between the skeleton 1 and the sensor element 5 and on the other hand between the heating element 3 and the sensor element 5. In a manner known per se, these capacitances depend on the difference of the respective radii r1, r2, r4 and the dielectric constant of the foam layer 2. It should also be considered that the parasitic capacitances can change and thereby distort a measurement result. Such change for example is effected in that the heating wire of the heating element 3 expands when heated, whereby the distances between the individual layers are changed. A change in the parasitic capacitance also can be effected by mechanical manipulation, for example by deformation of the foam layer 2 when the steering wheel rim is actuated by the driver.

By using the electrically conductive shielding element 4, these parasitic capacitances are masked out. The capacitive sensor element 5 hence detects only those changes in capacitance which are connected with a desired measurement.

Thus, an electrically conductive shielding element 4 is provided, which is located between the heating element 3 and the capacitive sensor element 5 and which shields the capacitive sensor element 5 against the heating element 3. In the exemplary embodiment of FIGS. 1 and 2 shielding also is effected against the skeleton 1. What is also conceivable, however, are exemplary embodiments in which the capacitive sensor element 5 is arranged on the inside of the shielding element 4 and the heating element 3 is arranged on the outside of the shielding element 4, for which case merely a parasitic capacitance between the heating element 3 and the sensor element 5 is masked out by the shielding element 4.

In further exemplary embodiments, a heating layer 3 or heating elements are omitted. For this case, only the elements or layers 1, 2, 4, 5, 6 are provided in the exemplary embodiment of FIG. 1. The shielding element 4 represents a shield against the skeleton 1.

For providing the function of a capacitive shield, an electric potential is applied to the shielding element 4. In principle, this can be any reference potential. In one exemplary embodiment it is provided that the shielding element 4 is driven to the same potential as the electrically conducting structure of the sensor element 5.

FIG. 6 shows a corresponding circuit arrangement. The circuit arrangement comprises a measurement signal generator 91 which for example provides a sinusoidal measurement signal. After low-pass filtering by a low-pass filter 92, the same is supplied to two amplifiers 93, 94, which each comprise an operational amplifier OP1, OP2 and a resistor R1, R2. Via a further operational amplifier OP3, a reference voltage $U_{ref}$ is provided. Via a multiplexer 95, a potential for the shielding element 4 is provided at a contact 96 and a measurement signal for the sensor element 5 is provided at a contact 97. The evaluation of the measurement signal is effected in that changes of the measurement signal, which are based on a change in capacitance, are supplied to a further evaluation 99 via a low-pass filter 98.

One function of the illustrated circuit consists in detecting the impedance of a sensor element 5 connected to the contact 97 and in reporting the detected impedance to a microprocessor system. The impedance is measured for example in that a sinusoidal voltage is applied to the sensor element 5 and the current response triggered thereby is measured. Changes in the impedance are measured as amplitude and phase changes of the detected current.

Another function of the illustrated circuit consists in the provision of a voltage at the contact 96 which is electrically connected with the shielding element 4. Since the voltage signal is generated by the same circuit assembly, in particular the same measurement signal generator 91, as the measurement signal provided at the contact 97, the signals or voltages provided at the two contacts 96, 97 have the same phase. In principle, however, it is also possible that a separate circuit is provided for providing a certain potential at the contact 96, to which the shielding element 4 is driven for providing an "active shield" against parasitic capacitances. Since the applied potential and the measurement signal have the same phase, a particularly effective shielding of the sensor element 5 against parasitic capacitances is effected.

Shielding element 4 and sensor element 5 thus have the same electric potential. A capacitance between the sensor element 5 and the shielding element 4 thereby is suppressed completely. In this way, there is merely detected a change in capacitance which is accompanied by a desired measurement, for example the detection of the presence of a person or the detection of the hand of a person resting on the steering wheel rim.

The connection between shielding element 4, heating element 3 and capacitive sensor element 5 will be explained below with reference to several exemplary embodiments. In these exemplary embodiments, a heating conductor of the heating element 3 and/or a sensor conductor of the capacitive sensor element 5 is formed as sewing thread which is sewn up with a further thread. The shielding element 4 forms a carrier material for the individual threads.

Thus, according to the schematic sectional representation of FIG. 3 a sensor system is provided, which comprises a flat shielding element 4, a heating conductor 30 of a heating element, and a sensor conductor 50 of a capacitive sensor element. Furthermore, there is provided a holding thread 70 of a non-conducting material.

The shielding element 4 provides a flat carrier material for the heating conductor 30, the sensor conductor 50 and the holding thread 70. It includes at least one layer which is electrically conductive and to which an electric potential can be applied. For example, the shielding element 4 comprises a metal fabric which is formed by warp wires and weft wires.

The heating conductor 30 for example is formed by a wire which can be sheathed with a paint insulation 31. By the holding thread 70, it is fixed on the one side of the shielding element 4. The course of the holding thread 70 vertically to the course of the heating conductor 30 is to be understood schematically and by way of example only. In principle, the holding thread 70 can adopt any course which allows a fixation of the heating conductor 30 on the one side of the flat shielding element 4.

On the other side of the shielding element 4 the sensor conductor 50 is arranged, which represents an electrically conducting structure of a capacitive sensor element. The sensor conductor 50 for example is formed by a wire which can be sheathed with a paint insulation. It is formed as sewing thread, i.e. it has a thickness and flexibility such that it is usable in a sewing process.

In the exemplary embodiment of FIG. 3, for example, it is provided that the sensor conductor 50 and the holding thread 70 together form a seam 8, wherein the sensor conductor 50 forms the bottom thread and the holding thread 70 forms the face thread of the seam 8. The sensor conductor 50 and the holding thread 70 correspondingly form two sewing threads N1, N2.

Thus, there is provided a structure in which the heating element and the capacitive sensor element are formed on different sides of a flat shielding element 4, which serves as carrier material, wherein the heating element and/or the capacitive sensor element include structures in the form of a sewing thread which can be sewn up on the carrier material with a further thread.

The configuration of FIG. 3 is to be understood by way of example only and can undergo various modifications. In a first modification it can be provided that the sensor wire 50 is fixed on the one side of the shielding element 4 by means of a holding thread, while the heating conductor on the other side of the shielding element is provided without such holding thread. By reversing the conditions of FIG. 3, the heating thread and the holding thread form a seam in such configuration, wherein heating conductor and holding thread form face thread and bottom thread of a seam.

A further modification can provide that the holding thread 70, which in FIG. 3 is formed as non-conducting thread, likewise is formed by an electrically conducting wire or other conductor which can be sheathed with an insulating layer. Such further conducting wire can represent a part of a further capacitive sensor or a further heating element.

A further modification provides that both the heating conductor 30 and the sensor conductor 50 are sewn onto the respective side of the shielding element 4 by a respectively associated holding thread. The holding threads then for example are sewn up with each other (forming face thread and bottom thread) or are each sewn up separately with the carrier material 4.

With a further modification no holding thread is realized at all, and the heating conductor 30 and the sensor conductor 50 themselves form face thread and bottom thread. However, this involves the disadvantage that due to the contact between face thread and bottom thread or between heating conductor and sensor conductor a mutual capacitive interference can occur, which actually should be prevented by the shielding element 4. In such a case, however, it might be provided that the distance between the connecting points of heating conductor 30 and sensor conductor 50 is chosen large, in order to minimize a mutual interference.

Figure 4A:
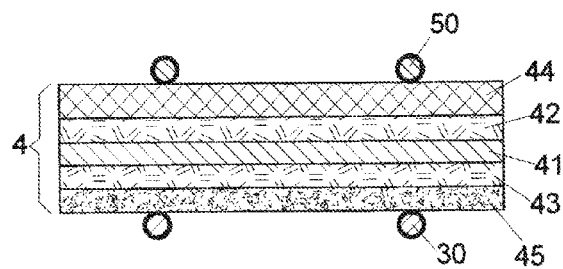
FIGS. 4A-4G show exemplary embodiments of sensor arrangements with a shielding element, a heating element and a capacitive sensor element, wherein different layers are present, which form the shielding element and/or adjacent layers.
Figure 4B:
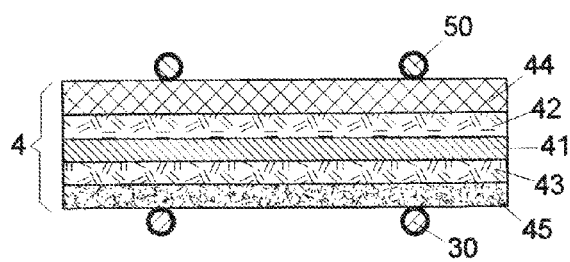
Figure 4C:
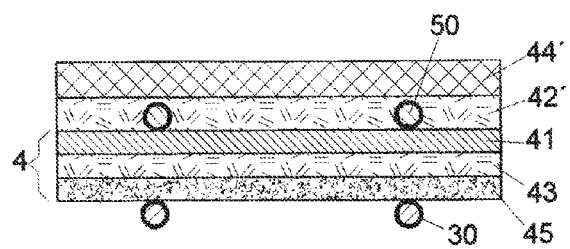
Figure 4D:
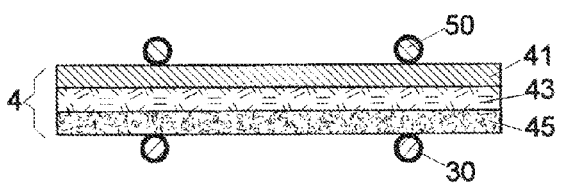
Figure 4E:
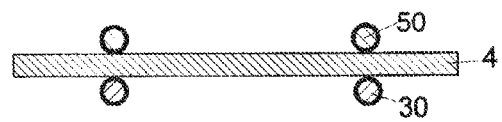
Figure 4F:
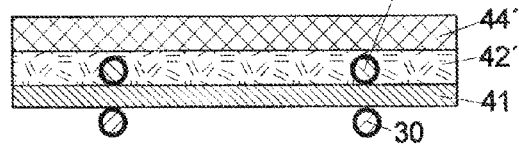
Figure 4G:
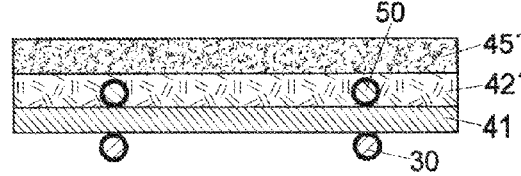

FIGS. 4A to 4G show exemplary embodiments for the structure of a sensor element corresponding to FIG. 3. The sensor element is constructed as multi-layer system. In FIGS. 4A, 4B, 4C and 4D it is provided that the shielding element 4 has a multi-layer structure. In FIGS. 4C, 4F, 4G it is provided that further layers are present, which adjoin the shielding element 4.

FIG. 4A shows an exemplary layer structure in which the shielding element 4 consists of five layers, an electrically conductive layer 41 with a wire fabric, an adhesive layer 42, 43 arranged above and below the same, a foam layer 44, and a fleece 45. On the two sides of the shielding element 4, as described with respect to FIG. 3, a heating conductor 30 of a heating element and a sensor conductor 50 of a sensor element are arranged. In particular by integrating a fleece into the shielding element 4 as layer 45, a secure sewing up of the respective wires 30, 50, 70 on the shielding element 4 is facilitated.

The exemplary embodiment of FIG. 4B in principle corresponds to the exemplary embodiment of FIG. 4A. In the exemplary embodiment of FIG. 4B, however, it is provided that the electrically conducting wire fabric 41 is oriented in a way other than in the exemplary embodiment of FIG. 4A. This is indicated by a different dashing of the layer 41 in FIGS. 4A, 4B. In FIG. 4A, for example, it is provided to arrange the warp wires and weft wires of the wire fabric at right angles or parallel to the sensor wires 50 and heating wires 30, respectively. In FIG. 4B it is provided to offset the warp wires and weft wires of the wire fabric by an angle unequal to 90°, for example of 45° with respect to the heating wires 30 and sensor wires 50. In this way, an increased stretchability of the entire element is achieved.

In FIG. 4C, the shielding element is formed by the electrically conductive layer 41, an adhesive layer 43 and a fleece 45. On the upper side, an adhesive layer 42' and a foam layer 44' are formed in addition.

In FIG. 4D, the shielding element consists of an upper electrically conducting layer 41, an adhesive layer 43 located thereunder, and a fleece layer 45.

In FIG. 4E, the shielding element 4 consists of only one layer which is electrically conductive and for example formed by a wire fabric.

In FIG. 4F, an adhesive layer 42' and a foam layer 44' are placed over the structure of FIG. 4E. In FIG. 4G, an adhesive layer 42' and a fleece 55' are placed over the structure of FIG. 4E.

The design variants according to FIGS. 4A to 4G can be realized with a heating conductor 30 or a sensor conductor 50 as face thread or bottom thread and possibly by using one or more additional holding threads, as described with reference to FIG. 3 and the respective modifications.

A further modification consists in that the realization of a heating layer and the use of a heating conductor 30 is omitted. Otherwise, the described sensor structure remains the same.

The invention is not limited in its configuration to the exemplary embodiments described above, which merely are to be understood by way of example. For example, the used materials and forms of the described electrically conducting structures merely are to be understood by way of example.

The invention claimed is:
1. A sensor system for a motor vehicle, which comprises:
a flat shielding element comprising a fabric of metal threads which is electrically conductive and to which a first electric potential is applied, and
at least one capacitive sensor element, which includes an electrically conducting structure which is arranged on a first side of the shielding element, wherein as electrically conducting structure, the at least one capacitive sensor element includes at least one sensor conductor which forms a sewing thread and is sewn onto the first side of the shielding element, wherein a second potential is applied to the at least one sensor conductor, such that the fabric of metal threads of the shielding element masks any parasitic capacitance between the at least one sensor conductor and any electrically conductive material disposed adjacent a second side of the shielding element, wherein the second side of the shielding element is opposite and spaced apart from the first side of the shielding element, a holding thread, wherein the sensor conductor and the holding thread together form a seam, wherein the sensor conductor and/or the holding thread at least partially extend through the shielding element.

2. The sensor system according to claim 1, wherein the sensor conductor forms the bottom thread or face thread of the seam which is formed in the shielding element.

3. The sensor system according to claim 1 wherein the shielding element includes a plurality of interconnected layers of different materials, wherein at least one of the layers is the fabric of metal threads.

4. The sensor system according to claim 3, wherein in addition to the fabric of metal threads, the shielding element includes at least one non-conducting layer selected from the group consisting of an adhesive material, a foam material and a fleece.

5. The sensor system according to claim 4, wherein the fabric of metal threads is arranged between at least two non-conducting layers or adjacent to at least two non-conducting layers of the shielding element in a sandwich construction.

6. The sensor system according to claim 1, wherein the fabric of metal threads comprises a wire fabric with warp threads and weft threads, which are offset with respect to heating conductors and/or sensor conductors by an angle unequal to 90°.

7. The sensor system according to claim 1, wherein for measuring a quantity to be measured a modulated measurement signal is applied to the sensor element and a change in the phase and/or amplitude of the measurement signal is evaluated.

8. The sensor system according to claim 1, wherein the first potential and the second potential are the same, the sensor system further comprising a circuit arrangement which drives the first potential and the second potential.

9. The sensor system according to claim 8, wherein the second potential is a modulated measurement signal, and for measuring a quantity to be measured, the modulated measurement signal is applied to the sensor element and a change in the phase and/or amplitude of the measurement signal is evaluated, and wherein the first potential applied to the shielding element has the same phase as the measurement signal applied to the sensor element.

10. The sensor system according to claim 9, wherein the measurement signal for the sensor element also is applied to the shielding element.

11. The sensor system according to claim 1, wherein the sensor system is provided and formed to be integrated into a vehicle steering wheel or into a vehicle seat.

12. The sensor system according to claim 1, wherein the sensor system includes at least one heating element which is arranged on the second side of the shielding element.

13. The sensor system according to claim 12, wherein the heating element includes at least one heating conductor which is sewn onto the second side of the shielding element.

14. The sensor system according to claim 13, wherein the heating conductor itself forms a sewing thread which is interlaced with the shielding element and/or at least one further sewing thread.

15. The sensor system according to claim 13, wherein the heating conductor is sewn onto the second side of the shielding element by means of the holding thread which fixes the heating conductor on the other side of the shielding element.

16. The sensor system according to claim 15, wherein the holding thread is made of a non-conducting material.

17. The sensor system according to claim 1, wherein the sensor conductor is interlaced with at least one further sewing thread.

18. The sensor system according to claim 15, wherein the sensor conductor is interlaced with at least one further sewing thread and the sensor conductor and the holding thread form at least one seam and in doing so form bottom thread and face thread of the seam.

19. The sensor system according to claim 1, wherein the first and second potentials are the same.

* * * * *